United States Patent [19]

Faretra

[11] 4,282,924
[45] Aug. 11, 1981

[54] APPARATUS FOR MECHANICALLY CLAMPING SEMICONDUCTOR WAFER AGAINST PLIABLE THERMALLY CONDUCTIVE SURFACE

[75] Inventor: Ronald A. Faretra, Melrose, Mass.

[73] Assignee: Varian Associates, Inc., Palo Alto, Calif.

[21] Appl. No.: 21,362

[22] Filed: Mar. 16, 1979

[51] Int. Cl.³ .............................................. B23Q 3/00
[52] U.S. Cl. .................. 165/80 E; 269/903; 204/298; 165/80 C
[58] Field of Search ............... 165/1, 80; 269/21, 236, 269/321 WE; 204/298; 62/373

[56] References Cited

U.S. PATENT DOCUMENTS

| 3,853,313 | 12/1974 | Abbenzeller | 269/21 |
| 3,853,740 | 12/1974 | Kunz | 204/298 |
| 4,139,051 | 2/1979 | Jones et al. | 165/1 |

FOREIGN PATENT DOCUMENTS 2431507   1/1976   Fed. Rep. of Germany ... 269/321 WE

OTHER PUBLICATIONS

IBM Technical Disclosure Bulletin, Author, W. Von Kaenel, (vol. 6, No. 7, Dec. 1963).

IBM Technical Disclosure Bulletin, Author, Perkins et al., (vol. 13, No. 5, Oct. 1970).

Primary Examiner—Samuel Scott
Assistant Examiner—Theophil W. Streule, Jr.
Attorney, Agent, or Firm—Stanley Z. Cole; Norman E. Reitz

[57] ABSTRACT

An apparatus for providing active cooling for semiconductor wafers during implantation in an ion implantation chamber includes a housing incorporating a convexly curved platen. The platen has a coating of a pliable thermally conductive material adhered to the surface thereof. A clamping ring is mounted within the housing in slidable relationship with the convexly curved platen so that the travel of the clamping ring ranges between a receiving position wherein the clamping ring and the convexly curved platen define a slot for receiving a semiconductor wafer and a locked position wherein a semiconductor wafer is firmly pressed against the convexly curved platen by the contact of the clamping ring against the semiconductor wafer at its circumferential edge. In the locked position the wafer substantially conforms on its back side to the contour of the convexly curved platen. An active cooling means is provided for transferring thermal energy away from the platen.

8 Claims, 8 Drawing Figures

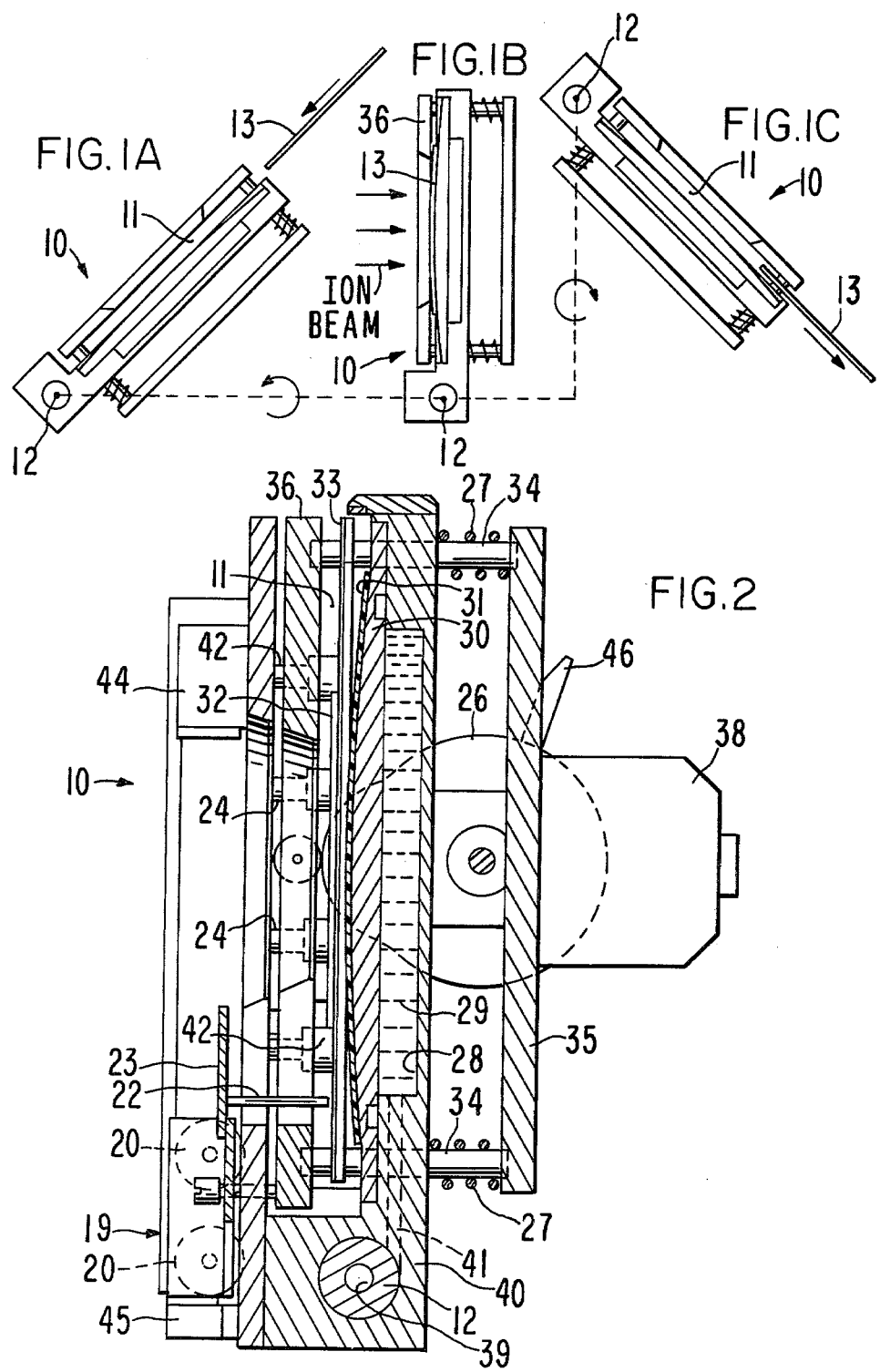

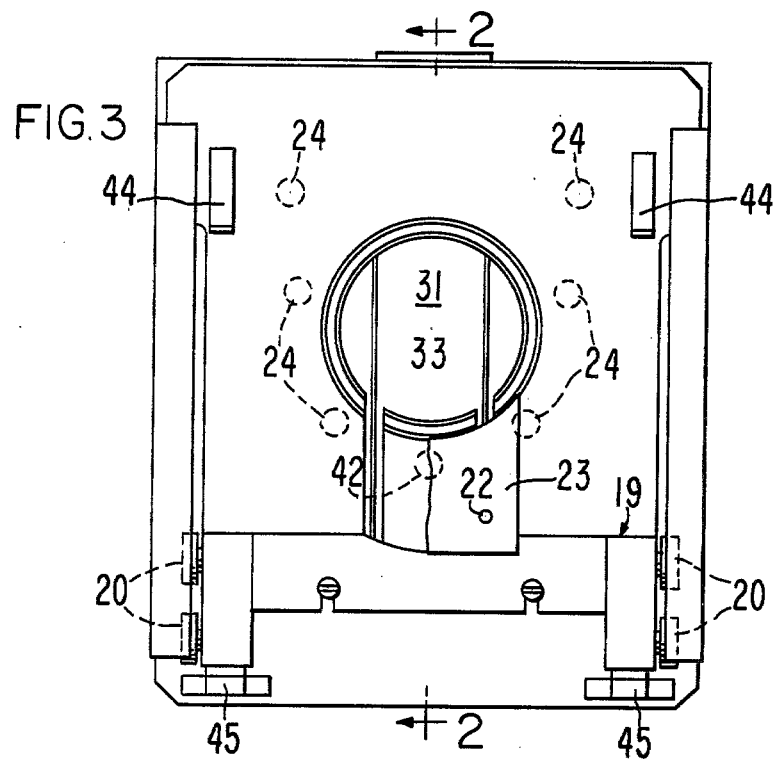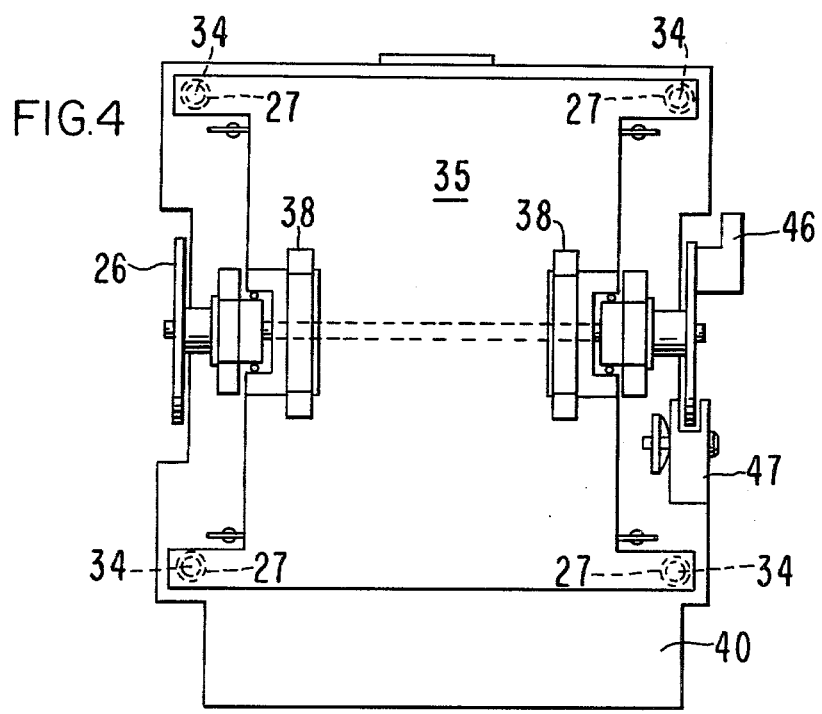

APPARATUS FOR MECHANICALLY CLAMPING SEMICONDUCTOR WAFER AGAINST PLIABLE THERMALLY CONDUCTIVE SURFACE

BACKGROUND OF THE INVENTION

This invention relates to an apparatus for thermally cooling semiconductor wafers and, more particularly, relates to an apparatus for mechanically clamping a semiconductor against a pliable thermally conductive surface to permit the cooling of the wafer.

In the processing of semiconductor wafers, e.g., in order to fabricate integrated circuits, it is sometimes necessary to subject the wafers to elevated temperatures. For the diffusion of impurities, the growth of epitaxial layers, annealing of metal-semiconductor contacts, and the like, such elevated temperatures are desirable. However, at many points in processing it is undesirable to expose the wafer to elevated temperatures since gratuitous diffusion beyond prescribed limits, as well as the segregation of impurities at epitaxial interfaces is not desired. Also, intermediate photoresist layers may be affected at such temperatures. This problem is enhanced in the fabrication of large scale integration (LSI) and very large scale integration (VLSI) devices since a large number of processing steps must be used in sequence; in particular, near the end of the processing sequence there are large numbers of impurities, conducting layers or insulating layers in place and it is not desirable to disturb these physical features by thermal treatment. Thus, it is desirable to expose semiconductor wafers to elevated temperatures only when a process step positively requires it and, if necessary, to be able to cool a semiconductor wafer to prevent elevated temperatures from being attained.

Ion implantation has become a standard technique for introducing inpurities into semiconductor wafers. See, e.g., P. D. Townsend, et al., *Ion Implantation, Sputtering and their Applications*, pp. 262-263 (1976). Impurities are introduced into the bulk of semiconductor wafers by using the momentum of energetic ions as a means of embedding them in the crystalline lattice of the semiconductor material. The kinetic energy of the impinging ions determines the depth of penetration. The depth of penetration is normally chosen to be the appropriate depth at which the impurity will be permanently fixed. However, on occasion, thermal diffusion may be used as an adjunct to ion implantation, as in a low energy predeposition machine; in this situation, however, the subsequent thermal diffusion will be a specific process step with known time and temperature characteristics.

As energetic ions impinge on a semiconductor wafer and travel into the bulk, heat is generated by the atomic collisions. This heat can become significant as the energy level is increased. Also, it is sometimes desirable for economic reasons in commercial applications to have a high throughput; consequently, as high an ion flux as does not do physical damage to the structure of the semiconductor material of the wafer will be used. Large amounts of heat may thus be generated. As set out above, this heat is undesirable.

Previous attempts to cool semiconductor wafers which are undergoing ion implantation include effecting intermittent exposure by scanning either or both the ion beam or the wafer (thereby limiting throughput), providing an actively cooled metal plate, coated with grease or oil, for the semiconductor wafer to rest upon, and applying an electrostatic force to hold a wafer against a slightly compressible surface on an actively cooled plate (see L. D. Bollinger, "Ion Milling for Semiconductor Production Processes", Solid State Technology, November 1977). These prior art techniques and devices have proven to not be wholly effective at cooling semiconductor wafers when high ion fluxes or energy levels are experienced.

It is therefore an object of the present invention to provide an apparatus for permitting the effective cooling of semiconductor wafers during ion implantation.

It is another object of the present invention to provide an apparatus for mechanically clamping a semiconductor wafer against a thermally conductive pliable material adhered to a convexly curved platen for rapid dissipation of thermal energy.

It is a still further object of the present invention to provide a device for thermally cooling semiconductor wafers which effects good thermal transfer without interference from any surface irregularities in the semiconductor wafers

SUMMARY OF THE INVENTION

An apparatus for providing active cooling for semiconductor wafers during implantation in an ion implantation chamber comprises a housing incorporating a convexly curved platen having a coating of a pliable thermally conductive material adhered to the surface thereof, a clamping ring mounted within the housing in slidable relationship with the convexly curved platen so that the travel of said clamping ring ranges between a receiving position wherein the clamping ring and the convexly curved platen define a slot for receiving a semiconductor wafer and a locked position wherein a semiconductor wafer is firmly pressed against said convexly curved platen by the contact of the clamping ring against the semiconductor wafer at its circumferential edge. In the locked position the wafer substantially conforms on its backside to the contour of the convexly curved platen. An active cooling means is provided for transferring thermal energy away from said platen.

BRIEF DESCRIPTION OF THE DRAWINGS

For a more complete understanding of the apparatus of the present invention reference may be had to the accompanying drawings which are incorporated herein by reference and in which:

FIG. 1A is a side pictorial view of the apparatus of the present invention in position to accept a semiconductor wafer by gravity feed;

FIG. 1B is a side pictorial view of the apparatus of the present invention in position to subject a semiconductor wafer to a normally incident ion beam;

FIG. 1C is a side pictorial view of the apparatus of the present invention rotated to a position at which an implanted semiconductor wafer is ejected by gravity or by an eject pin means;

FIG. 2 is a side cross-sectional veiw of the apparatus of the present invention taken along line 2—2 of FIG. 3;

FIG. 3 is a plan view of the apparatus of the present invention;

FIG. 4 is a bottom view of the apparatus of the present invention;

DESCRIPTION OF THE PREFERRED EMBODIMENTS

Figure 5:
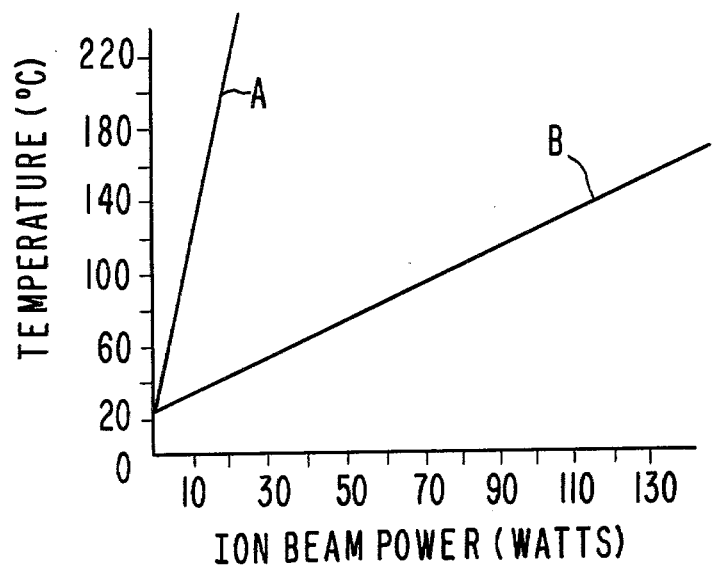
FIG. 5 is a graph illustrating equilibrium temperature for a three inch wafer as a function of ion beam power for a standard platen (A) and the apparatus of the present invention (B)

It has been determined that ion bombardment at high energy levels or at high flux rates leads to heating which requires active cooling. As set out heretofore the cooling requirement is produced by the need to protect photoresist from decomposition and the desire to avoid gratuitous diffusion. Such active cooling is only possible if a contact having good thermal transfer properties is made with the back side of the wafer; the front side of the wafer must necessarily be left exposed to the impinging ion beam and no adequate thermal transfer could be effected from the circumferential edge of the wafer. It has been established that it is difficult to obtain a planar contact which has good thermal transfer properties due to surface irregularities, sometimes called bowing, present in semiconductor wafers. A bow or surface depression might be as deep as 5 one-thousandths of an inch. Consequently, a rigid planar contact member makes contact only with the periphery of the bowed region and only radiative or convective, not conductive, thermal transfer would occur. Even with pliable contact materials it has been found most difficult with planar configurations to consistently contact the full contour of bowed regions.

Theory of Operation

The device of the present invention obtains a contact having good thermal transfer properties with the back side of a semiconductor wafer by placing the wafer on a convexly curved platen coated with a pliable thermally conductive layer and then mechanically clamping the wafer at its outer edge between a clamping ring and the platen. The semiconductor wafers are thin, on the order of 200 microns to 400 microns, and pliable up to their elastic limit. Thus, they bend to conform to the curved platen. The radius of curvature of the platen is selected to be large enough to smooth out the natural bowing by generating tension in the wafer; this permits consistent contact between the now-smooth contour and the pliable material. The radius of curvature is selected to be small enough so that the angle of incidence of the impinging ion beam does not exceed normal incidence by more than a specified amount, typically $2\frac{1}{2}$ degrees. On a three inch wafer, a deviation of fifteen one-thousandths of an inch from the center to the edge has been found to produce a satisfactory curvature.

The use of a pliable thermally conductive covering for the platen is desirable in order to accommodate any residual bowing in the wafer when it is under tension. The different forces on the various parts of the wafer are best applied, for example, by a surface which will conform to some extent to the wafer so that the forces applied to adjacent regions of the wafer will vary gradually and not drastically, thus lessening the likelihood of exceeding the elastic limit at the boundaries between such adjacent regions. The thickness of the covering should be great enough so a cushioning effect is obtained but not so thick that a significant barrier to heat transfer is established. With thermally conductive silicone rubbers such as Eccosil 4952 (a registered trademark), available from Emerson & Cumming, Inc., an optimum thickness has been determined to be nine one-thousandths of an inch. The material is adhered by standard techniques set out by the supplier.

Mechanical Operation

The overall sequence of operation can be seen by reference to FIGS. 1A to 1C. These figures illustrate a wafer cooling apparatus 10 which is installed within an ion implantation chamber. In the unlocked position the wafer cooling apparatus 10 is positioned to accept an incoming semiconductor wafer 13, as shown in FIG. 1A, which is typically introduced by gravity into slot 11. The apparatus 10 is rotated as indicated by the arrow by support rod 12 to a position, typically the vertical position of FIG. 1B, normal to the path of incidence of a working ion beam. During the positioning process, as described subsequently with respect to FIG. 2, the wafer 13 is locked in place by a clamping ring and flexed under tension against the convexly curved platen. The wafer is then actively cooled while implantation is carried out. After implantation is complete, wafer cooling apparatus 10 is then rotated as indicated by the arrow by support rod 12 to the position shown in FIG. 1C to permit the wafer 13 to be ejected either by the force of gravity or by an eject pin means to be described subsequently. As the apparatus 10 is rotated to the eject position, the clamping ring and platen are disengaged and wafer 13 is free to slide out of slot 11.

The mechanical features of the wafer cooling apparatus 10 are illustrated in detail in the cross section of FIG. 2, taken along line 2—2 of FIG. 3, and in FIGS. 3 and 4. Housing member 40 has openings configured therein to accommodate moveable rods 34. Moveable rods 34 are attached between bottom plate 35 and clamping ring 36. Springs 27 are held under compression between the bottom surface of housing 40 and bottom plate 35. The movement of bottom plate 35 with respect to housing 40 is accomplished by means of linear bearings 38, shown in FIG. 4. Cam 26, one of two cams attached to bottom plate 35 (both cams shown in FIG. 4), will at its high point of travel cause clamping ring 36 to reach the receiving or eject position at which it is lifted above slot 11 so that any wafer held therein may be released. At the low point of the travel of cam 26 the springs 27 will expand and pull clamping ring 36 down to its locked position against the circumferential edge of a wafer 32 in place in slot 11. In this position the back side of wafer 32 substantially conforms to the coating of pliable thermally conductive material 31 applied to the surface of convexly curved platen 30.

The active cooling of apparatus 10 is accomplished by flowing liquid freon 29 into a reservoir defined by interior cavity 28 within housing 40. The freon is supplied through an input port 39 within support rod 12 and is communicated via channel 41 within housing 40 to reservoir 28. A coaxial output port also within support rod 12 (not shown) provides freon an exit path from the apparatus. The temperature of the liquid freon and the rate of flow can be varied to control the temperature of the wafer. Typically, it is desired to maintain a surface temperature on wafer 32 of less than 140° C.

As seen in the dotted line renderings of FIG. 2 and in the plan view of FIG. 3, a series of track bumpers 24 define a track within slot 11 for the loading and unloading of semiconductor wafers. End bumper 42 provides a final stopping place for the wafer prior to clamping. The bumpers are constructed of a silicone rubber compound so that the wafer is not damaged during insertion.

As described above with respect to FIGS. 1A–1C, the loading of wafers into and the unloading of wafers from the wafer cooling apparatus 10 is intended to occur by gravity feed. To avoid friction between the semiconductor wafer and the pliable thermally conductive surface 31, a pair of low friction guide rails are used during loading and unloading; these may be constructed of metal or low friction plastic. As seen in FIG. 2, the guide rails 33 keep the wafer above the pliable thermally conductive coating 31 until the wafer is locked in place. During unloading the rails lift the wafer off of the surface of the pliable thermally conductive material so that the wafer may slide easily along the rails. Since guard rails 33 are attached to moveable rods 34 they move up and down with the movement of the rods and can go below the surface of pliable thermally conductive coating 31 into recesses formed in the conductive coating 31 and in the convexly curved platen itself when clamping ring 36 is in the locked position. On occasion, a wafer will not slide smoothly along the guide rails 33 or will take longer than desirable to slide out of the assembly. An eject pin 22, then, will push the wafer along the guide rails 33 and out of slot 11. Eject pin 22 is attached to moveable assembly 19 which moves by means of wheels 20 between stops 44 and stops 45. The track in which moveable assembly 19 moves is shielded from the ion beam by shield 23.

As described above with respect to FIGS. 1A–1C the wafer cooling apparatus 10 is held in a vertical position during implantation so that the assembly is held by the force of gravity against the stops 45. As the wafer cooling apparatus 10 is rotated to the eject position the slidable assembly 19 with eject pin 22 moves along its track as far as stops 44 insure that the wafer is in fact ejected. Normally, the wafer will eject itself by the force of gravity. The movement of the cams 26 is actuated when arm 46 is forced against protruding members (not shown) attached to the inside of the ion implantation chamber in which the apparatus 10 is mounted. As apparatus 10 is rotated by support rod 12 the arm 46 engages the protruding members and forces the cams 26 to travel between its high and low positions. Thus, in the implantation position of FIG. 1B, cams 26 will be at their low position and the clamping ring 36 will be pressed against a wafer. In the receiving position of FIG. 1A and in the eject position of FIG. 1C, cams 26 will be in their high position and a slot 11 will be defined. The ease of movement of cams 26 is determined by the setting of brake clutch 47, shown in FIG. 4, which controls the speed of rotation of the cams 26. Consequently, the forces applied by spring 27 cannot cause clamping ring 36 to come crashing down on a semiconductor wafer in place within the wafer cooling apparatus 10.

Figure 6:
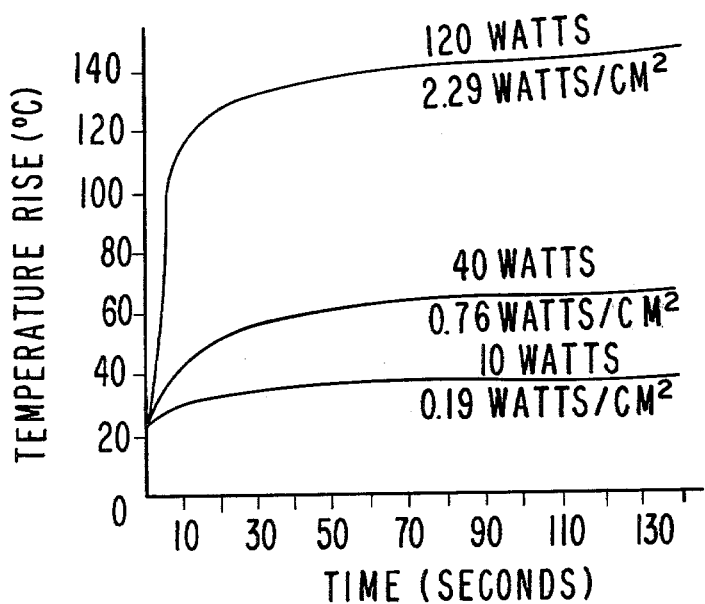
FIG. 6 is a graph of temperature rise times for a three inch wafer undergoing ion implantation while held in the apparatus of the present invention.

The advantage of the wafer cooling assembly of the present invention can be seen by reference to FIGS. 5 and 6. In FIG. 5 the relationship between temperature and ion beam power is shown for a standard platen (A) (uncooled metal surface resting under its own weight) is compared with the platen of the present invention (B). The temperature presented in the graph is an equilibrium temperature of a three inch wafer. In FIG. 6, the temperature rise of a cooled three inch wafer is shown as a function of time for three different ion beam powers. A near-equilibrium temperature is reached after about 10 seconds. An acceptable temperature rise characteristic is obtained for the implantation of semiconductor wafers since wafers typically are implanted for a period from 5 to about 15 seconds and the typical allowable temperature level is 140° C.

What is claimed is:

1. An apparatus for providing active cooling for semiconductor wafers during implantation in an ion implantation chamber, comprising:
   a housing incorporating a convexly curved platen, said platen having a coating of a pliable thermally conductive material adhered to the surface thereof;
   a clamping ring mounted within said housing in slidable relationship with said convexly curved platen, the travel of said clamping ring ranging between a receiving or eject position wherein said clamping ring and said convexly curved platen define a slot for receiving or rejecting a semiconductor wafer and a locked position wherein a semiconductor wafer is firmly pressed against said convexly platen by the contact of said clamping ring against said semiconductor wafer at its circumferential edge, said wafer substantially conforming on its back side to the contour of said convexly curved platen;
   actuating means for determining the position of said clamping ring with respect to said convexly curved platen; and
   active cooling means for transferring thermal energy from said platen.

2. An apparatus in accordance with claim 1 wherein said actuating means comprises a spring biased cam arrangement for slidably moving said clamping ring with respect to said convexly curved platen, the relative position of the cam axis and the cam follower determining the relative position of said clamping ring and said convexly curved platen, said cam being actuated by an integral arm attached thereto which comes in contact with protruding rollers affixed to the ion implantation chamber in which said apparatus is mounted so that said clamping ring slides to its locked position as said apparatus is rotated to an implantation position and said clamping ring slides to its receiving or eject position as said apparatus is rotated away from said implantation position.

3. An apparatus in accordance with claim 2 in combination with an assembly moveable with respect to said housing, said assembly including an eject pin means for contacting an edge of said wafer when said clamping ring and said convexly curved platen are in said eject position and said housing is rotated to permit ejection of said wafer by gravity flow, said assembly riding in a track on said housing between a position in which said eject means is adjacent said slot and a position in which said eject means has substantially traversed the length of said slot to eject a wafer contained therein.

4. An apparatus in accordance with claim 2 in combination with guide rails attached to said clamping ring and adapted to allow a semiconductor wafer to ride above said pliable thermally conductive material when said apparatus is receiving or ejecting the wafer and adapted to fit into recesses in said pliable thermally conductive material and said platen when said wafer is locked into position.

5. An apparatus in accordance with claim 4 wherein said active cooling means comprises a cavity configured within said housing for containing liquid freon, said cavity having input and output ports to permit the flow of liquid freon through said cavity.

6. An apparatus in accordance with claim 5 in combination with a pair of linear bearings attached between said clamping ring and said housing for producing the travel of said clamping ring with respect to said convexly curved platen.

7. An apparatus in accordance with claim 6 in combination with a brake clutch for controlling the speed of rotation of said cams.

8. An apparatus in accordance with claim 7 in combination with a series of track bumpers attached to said housing to define a track for wafer travel within said slot and an end bumper for determining the resting position of a wafer within said slot.

* * * * *